United States Patent
Fleury et al.

(12) 
(10) Patent No.: US 6,747,916 B1
(45) Date of Patent: Jun. 8, 2004

(54) COMMUNICATION SYSTEM BETWEEN A PORTABLE UNIT AND A COMMUNICATION TERMINAL

(75) Inventors: Emmanuel Fleury, Moutier (CH); Fabien Blondeau, Le Landeron (CH); David Barras, Grenchen (CH); Pierre-André Meister, Biel (CH)

(73) Assignee: Eta SA Fabriques d'Ebauches, Grenchen (CH)

( * ) Notice: Subject to any disclaimer, the term of this patent is extended or adjusted under 35 U.S.C. 154(b) by 0 days.

(21) Appl. No.: 10/031,617

(22) PCT Filed: Nov. 26, 1999

(86) PCT No.: PCT/EP99/09201

§ 371 (c)(1), (2), (4) Date: Jan. 22, 2002

(87) PCT Pub. No.: WO01/10064

PCT Pub. Date: Feb. 8, 2001

(30) Foreign Application Priority Data

Aug. 3, 1999 (EP) .............................. 99115319

(51) Int. Cl.[7] ........................ G04B 47/00; G04C 21/16; H01L 41/04
(52) U.S. Cl. ........................ 368/10; 368/255; 310/311
(58) Field of Search ............................. 368/10, 11, 46, 368/47, 250, 251, 255; 310/311, 321

(56) References Cited

U.S. PATENT DOCUMENTS

| | | | | | |
|---|---|---|---|---|---|
| 4,242,745 A | * | 12/1980 | Mutrux | ........................ | 368/73 |
| 4,567,766 A | * | 2/1986 | Seiferling | ..................... | 73/597 |
| 4,800,543 A | * | 1/1989 | Lyndon-James et al. | ...... | 368/10 |
| 4,955,000 A | * | 9/1990 | Nastrom | ....................... | 367/17 |
| 5,218,344 A | * | 6/1993 | Ricketts | ....................... | 340/573 |
| 5,640,144 A | * | 6/1997 | Russo et al. | ................. | 340/568 |
| 5,708,421 A | * | 1/1998 | Boyd | .......................... | 340/573 |
| 5,719,825 A | * | 2/1998 | Dotter | .......................... | 368/10 |
| 5,757,104 A | * | 5/1998 | Getman et al. | ............. | 310/317 |

FOREIGN PATENT DOCUMENTS

WO WO 99/55057 * 10/1999

* cited by examiner

*Primary Examiner*—Vit W. Miska
(74) *Attorney, Agent, or Firm*—Sughrue Mion, PLLC

(57) ABSTRACT

The present invention concerns a communication system between a portable unit, such as a watch, and a communication terminal (2) such as a personal computer or PC, characterized in that the communication terminal (2) includes at least means for transmitting an acoustic signal carrying, and in that the portable unit (1) includes at least processing means for processing data, and receiving and conversion means for picking up said acoustic signal and converting said acoustic signal into data intended to be processed by said processing means.

4 Claims, 4 Drawing Sheets

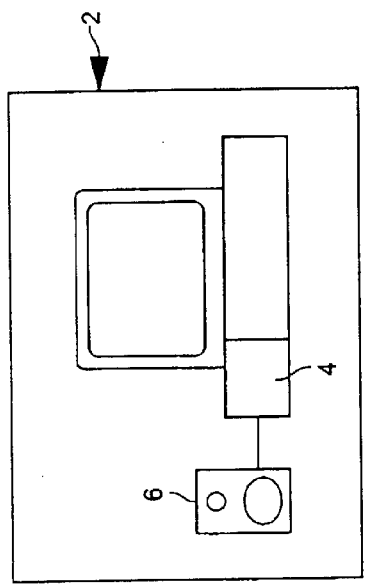
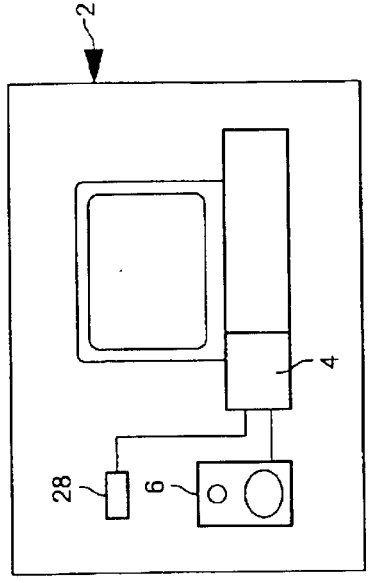
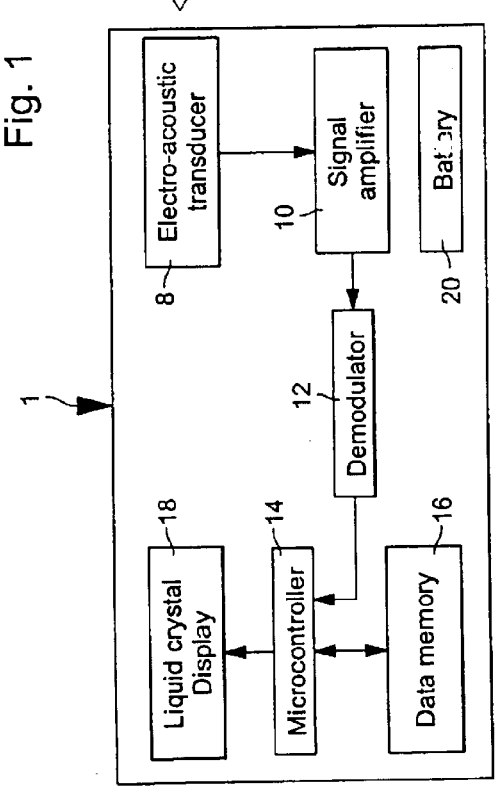
Fig. 1
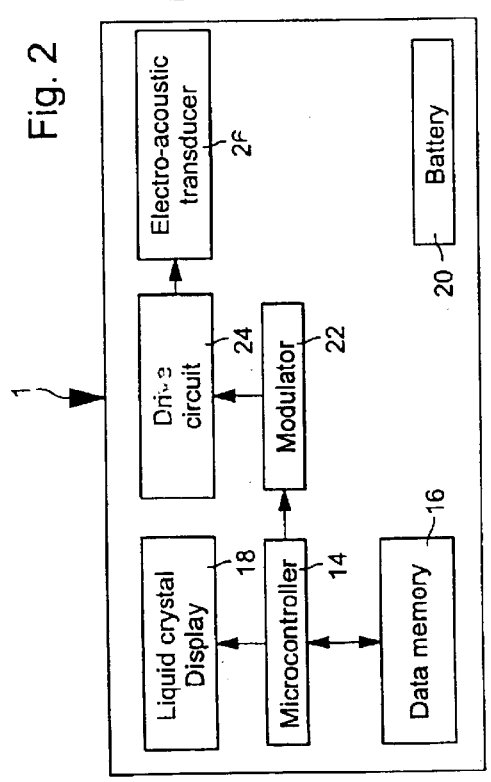
Fig. 2

Fig. 6
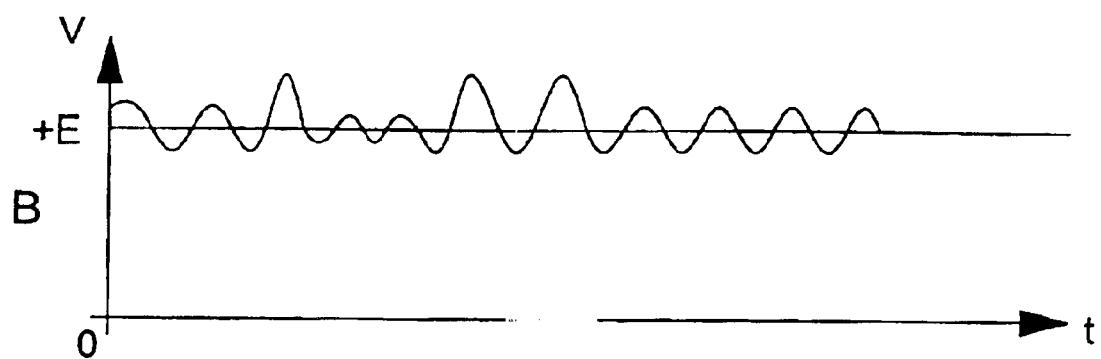
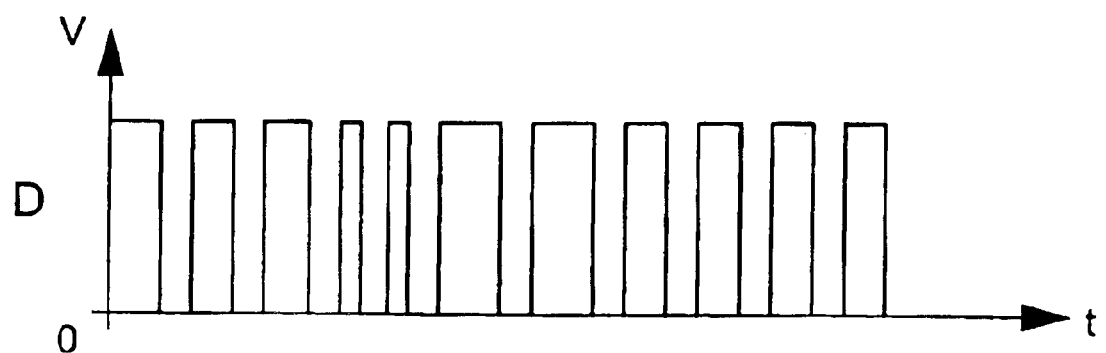

COMMUNICATION SYSTEM BETWEEN A PORTABLE UNIT AND A COMMUNICATION TERMINAL

The present invention concerns a communication system between a portable unit such as a watch and a communication terminal such as a personal computer or PC.

A system for processing personal data is known from U.S. Pat. No. 5,848,027 in the name of Biometrics Inc. This system allows, for example, the performance of an athlete, such as a runner, to be monitored. It enables the date and time of the race, the time for each lap, or the final time accumulated by the sportsman to be recorded. The system also enables the values of certain physiological parameters to be recorded, such as the heart rate or an electrocardiogram (ECG) which reflect the effort made by the athlete during his sporting activity. All this information will then be transmitted, via an acoustic link, to a personal computer in which the data will be processed, analysed, then finally displayed on the screen of said computer.

The Biometrics system described above advantageously enables personal data to be stored in a watch, then the data to be transmitted by acoustic waves to a computer where they will be processed and analysed. This system is unfortunately not two-directional. It is thus not possible to transfer data from the computer to the watch, which considerably limits the possible applications of the Biometrics system.

Moreover, communication systems wherein data is exchanged in a two-directional manner via a wireless link between a portable object and a communication terminal are known. By way of example, the case of digital personal assistant (PDA) able to communicate with a personal computer via radio-frequency waves may be cited.

When he is in his office, the user of such a system can enter his timetable for his working week into his computer, then transfer this data to his PDA. When travelling, the user can thus consult his diary at any time and see his commitments and availability. During a meeting, a time for another working session can be fixed at a subsequent date. Thus user can thus enter this new meeting into his electronic PDA as well as, for example, the identity and telephone number of the person he is meeting. When he returns to the office, the user will be able to transfer the new data entered into his PDA to the computer and update his timetable.

A wireless communication system via radio-frequency waves has been described. It goes without saying that other wireless communication systems, for example by infrared link or by inductive link, may also be used. All these systems advantageously allow a two-directional communication to be established for exchanging data between a portable unit and a communication terminal. However, these systems have the drawback of requiring transmission and/or receiving means suitable for the type of wireless link used, the cost and installation price of such means often being very high.

The object of the present Invention is to overcome the above problems and drawbacks in addition to others by proposing a reliable and inexpensive wireless communication system between a portable unit and a communication terminal.

The present invention thus concerns a communication system between a portable unit such as a watch, and a communication terminal such as a personal computer or PC, characterised in that the communication terminal includes at least means for transmitting an acoustic signal carrying an item of data, and in that the portable unit includes at least processing means for processing data, and receiving and conversion means for picking up said acoustic signal and converting said acoustic signal into data intended to be processed by said processing means.

As a result of these features, it is possible to enter data, for example into a personal computer, then to transfer said data via an acoustic link to the portable unit such as a wristwatch. A sound wave communication system which is much simpler, and consequently much less expensive than other currently known communication systems, for example infrared or radio-frequency systems, is thus obtained. Most communication terminals can, in fact, be used within the scope of the present invention without it being necessary to modify them or add transmission and/or receiving means suited to the type of wireless link used. Thus, when the communication terminal is a personal computer, one can use the loudspeakers which are commonly fitted to such computers to send an acoustic signal to the portable unit. One need only enter into the computer a programme allowing the acoustic signal to be modulated so that It can then be decoded by the portable unit. Likewise, when the acoustic signal is transmitted by a radio or by a television, one need only ensure that before being broadcast, the signal has been suitably modulated, so that it can then be received and converted Into data able to be processed by the processing means of the portable unit.

According to another aspect, the present invention concerns a communication system of the aforementioned type, characterised in that the portable unit further includes conversion and transmission means for converting data provided by said processing means of said portable unit into an acoustic signal carrying data and for transmitting an acoustic signal and In that the communication terminal further includes processing means for processing data and receiving and converting means for receiving said acoustic signal transmitted by the portable unit and for converting the signal into data intended to be processed by said processing means of said communication terminal.

As a result of these other features, one can not only transmit data from the communication terminal to the portable unit, but also transmit data from the portable unit to the data terminal, which considerably increases the number of possible applications of the communication system according to the invention.

Other features and advantages of the present invention will appear more clearly upon reading the following detailed description of an embodiment example of the communication system according to the invention, this example being given purely by way of non-limiting illustration, in conjunction with the annexed drawings, in which:

FIG. 1 is a schematic diagram of a first variant of the communication system between a portable unit and a communication terminal according to the invention;

FIG. 2 is a schematic diagram of a second variant of the communication system according to the invention;

FIG. 6 shows the voltage levels as a function of time at two places in the circuit of FIG. 4 when the circuit is used as a sound wave receiver.

Figure 3:
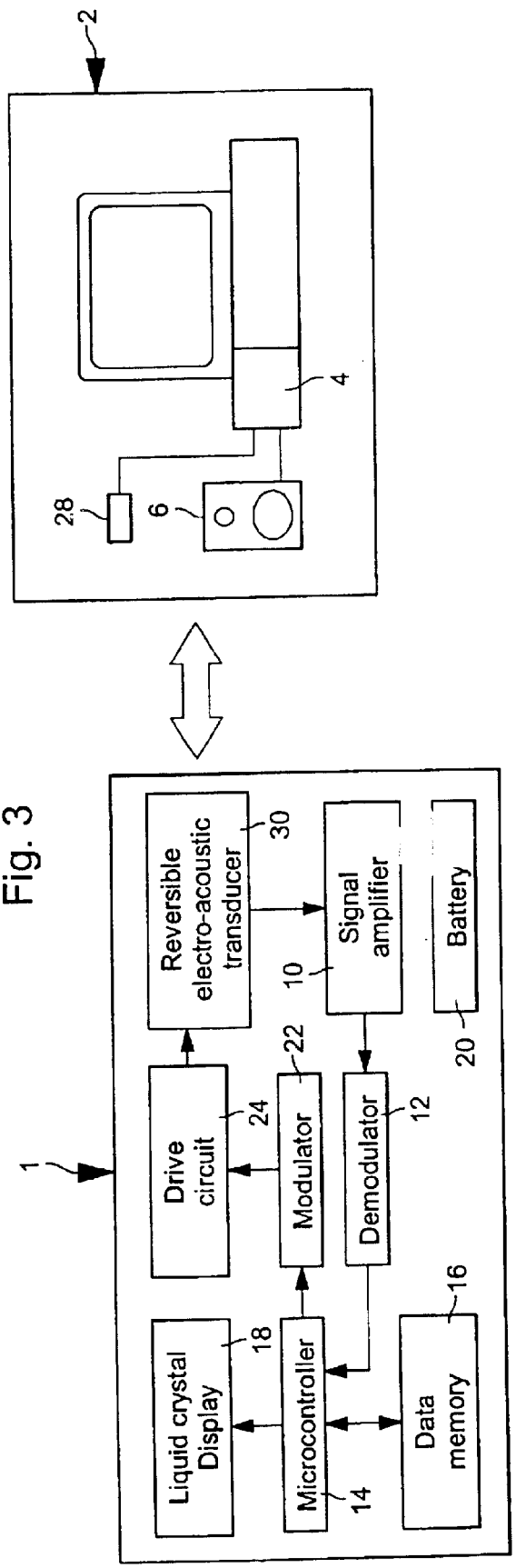
FIG. 3 is a schematic diagram of a third variant of the communication system according to the invention.

Within the meaning of the invention, "portable unit", means any object of small dimensions, such as, in a preferred but non limiting manner, a wristwatch, able to pick up an acoustic signal carrying data and transform this acoustic signal into data able to be processed by processing means to extract the data carried by the acoustic signal. According to a complementary feature of the invention, the portable object is also able to transmit data coded acoustic signals.

Within the meaning of the invention, "communication terminal" means any device such as, for example, a personal computer, a radio, a television, or a voice server able to be accessed by telephone and able to transmit acoustic signals carrying data. According to a complementary feature of the invention, the communication terminal is also capable of picking up data coded acoustic signals and transforming such acoustic signals into data able to be processed by processing means to extract the data carried by the acoustic signals.

FIG. 1 shows schematically a portable object such as, for example, a timepiece, designated as a whole by the general reference numeral 1, and a communication terminal such as, for example, a personal computer or PC, designated as a whole by the general reference numeral 2.

According to the invention, communication terminal 2 includes means for transmitting acoustic signals carrying data. In the example shown in FIG. 1, these means take the form of a sound card 4 arranged inside the personal computer, and one or more loudspeakers 6.

One of the advantages of the present invention also lies in the fact that it is not necessary to modify the structure of the computer or to add to the computer transmission elements suited to the type of wireless link used. In order to be able to implement the invention, one need only enter into the computer a programme allowing it to modulate the acoustic signal so that the signal can then be suitably decoded by portable unit 1.

When communication terminal 2 transmits an acoustic signal carrying data, this signal is immediately picked up by the receiving means of portable unit 1. These receiving means are formed by an electro-acoustic transducer 8 which plays the role of a microphone and which conventionally converts the incident acoustic signal into a succession of electric signals which will then be converted by conversion means of portable unit 1 into data intended to be processed by processing means in order to extract the useful data carried by the acoustic signal. In the example shown in FIG. 1, the conversion means of portable unit 1 include an amplifier 10 for the electric signal produced by electro-acoustic transducer 8 and a demodulator 12 connected to signal amplifier 10 and intended to demodulate the acoustic signal received by transducer 8 and to transmit the demodulated signal to an input of a microcontroller 14. Microcontroller 14 constitutes the processing means of portable object 1. The data carried by the acoustic signal transmitted by communication terminal 2, demodulated by demodulator 12 and processed by microcontroller 14, can be stored in a memory 16 of portable object 1 and/or displayed on a display device 18 for example a liquid crystal display. A battery 20, which may be rechargeable, supplies portable unit 1 with electric current.

In the following description, those elements which are identical to those described hereinbefore will be designated by the same reference numerals.

According to another aspect of the invention, with reference to FIG. 2, the case in which portable unit 1 transmits an acoustic signal to communication terminal 2, will now be examined. In this case, portable unit 1 will include, in addition to the means described hereinbefore, conversion and transmission means for converting data provided by the processing means of portable unit 1 into a modulated acoustic signal containing data and for transmitting this signal. As shown in FIG. 2, the conversion means of portable unit 1 include a modulation circuit 22 which, via a drive circuit 24, drive the transmission means, namely an electro-acoustic transducer 26 acting as a loudspeaker. The processing means of portable unit 1, i.e. microcontroller 14, control modulation circuit 22 using data originating from memory 16 associated with said microcontroller 14.

When portable unit 1 transmits an acoustic signal containing data, this signal is immediately picked up by the receiving means, in this case a microphone 28, of communication terminal 2. This acoustic signal is then converted by conversion means of communication terminal 2 into data able to be processed by processing means of said communication terminal 2. In the event that communication terminal 2 is a personal computer or PC, the conversion means for the acoustic signal carrying data are formed conventionally by the sound card 4 described hereinbefore which is capable of converting the acoustic signal received by microphone 28 into binary data which will be transmitted to an input of the microcontroller (not shown) of the personal computer in order to be demodulated and converted into data which can be stored in a memory of said microcontroller.

In the event that portable unit 1 transmits an acoustic signal containing data to the personal computer, one advantage of the present invention lies, here too, in the fact that it is not necessary to modify the personal computer to add components to it which are suitable for the type of wireless communication used.

According to another of its advantages, the present invention provides a two-directional communication system via acoustic waves between a portable unit 1 and a: communication terminal 2. This system is much simpler to implement and less expensive than other two-directional communication systems using, for example, an infrared link or a radio-frequency link. Moreover, with respect to systems of the prior art using communication via acoustic waves but only in a single direction from a watch to a PC, the system according to the invention permits a much larger number of applications.

According to a complementary feature of the invention, the conversion and transmission means and the receiving and conversion means of portable unit 1 use a single same electro-acoustic transducer 30 which operates in a reversible manner, i.e. both as a microphone and as a loudspeaker (see FIG. 3). When electro-acoustic transducer 30 operates in receiver mode, the electric signal which it generates via the effect of an incident electric signal is amplified by amplifier 10 then demodulated by demodulator 12. The signal demodulated by demodulator 12 is then transmitted to the input of microcontroller 14. Conversely, when electro-acoustic transducer 30 acts as a loudspeaker, it is activated by modulation circuit 22 via drive circuit 24. Microcontroller 14 controls modulation circuit 22 using data originating from memory 16 associated with said microcontroller 14.

A particular embodiment of electro-acoustic transducer 30, which consists in using a piezoelectric vibrator usually used as a sound generator in watches including an alarm device, as the acoustic wave receiver and/or transmitter, will now be examined. An electronic comparator circuit which is connected to the terminals of the piezoelectric vibrator and which generates at its output a pseudo-digital signal representative of the incident sound signal picked up by the vibrator and allowing the functions of a microcontroller to be controlled, will also be examined.

Figure 4:
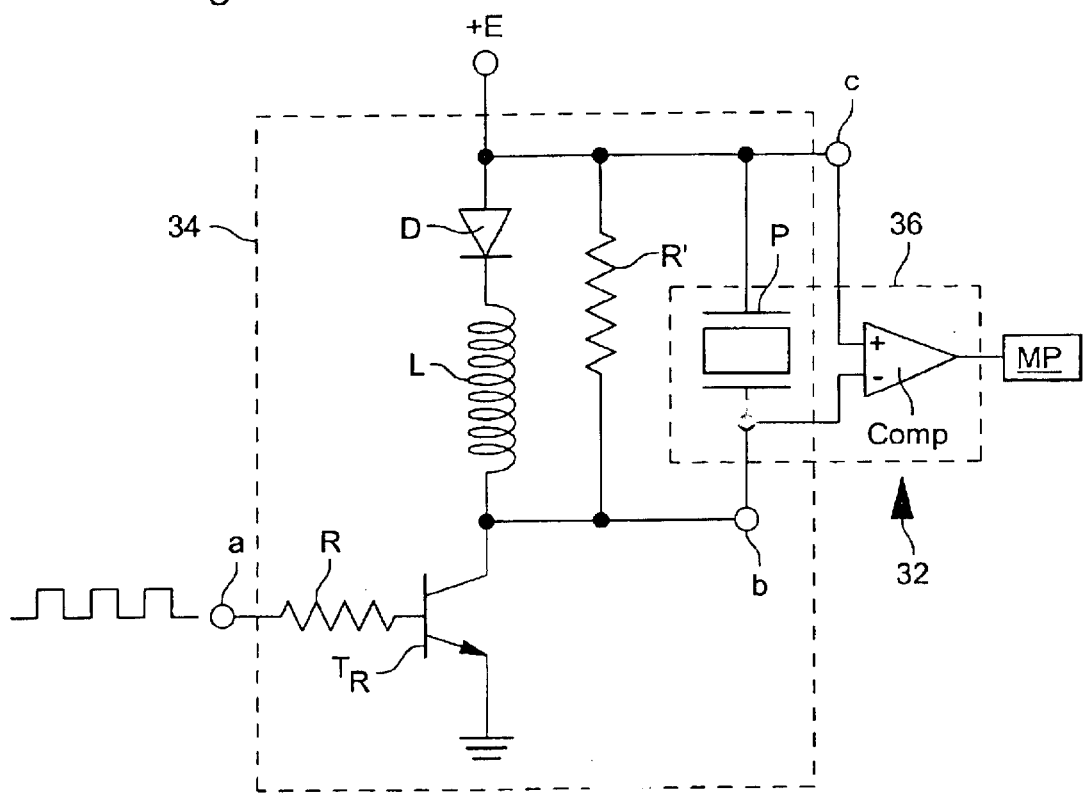
FIG. 4 shows an electric diagram of a circuit for converting an acoustic signal into data intended to be processed by the processing means of the portable unit.

FIG. 4 shows an electronic converter designated on a whole by the general reference numeral 32. As FIG. 4 shows, the aforementioned electronic converter 32 is formed by associating a drive circuit 34 of a piezoelectric vibrator P with a comparison circuit whose respective operating principles will be described hereinafter.

Drive circuit 34 of piezoelectric vibrator P includes a circuit branch in which a coil L and a diode D are;mounted in series, a resistor R' and piezoelectric vibrator P being connected in parallel across this circuit branch.

Figure 5:
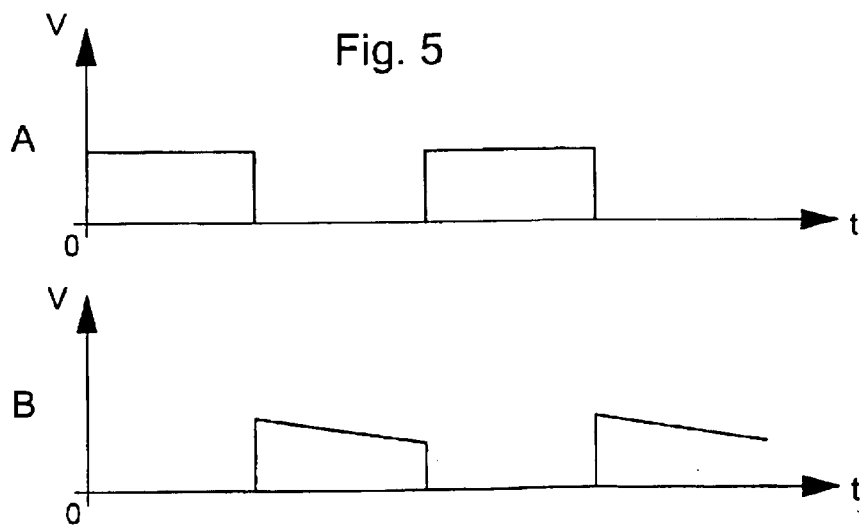
FIG. 5 shows the voltage levels as a function of time at two places in the circuit of FIG. 4.

Drive circuit 34 receives at an input terminal "a" a square pulse control signal "v"(curve A, FIG. 5). This control signal is applied via a resistor R to the base of a transistor $T_R$. When transistor $T_R$ is made conducting by a control pulse, a current supplied by a voltage source +E passes through coil L, whereas the connection node "b" of piezoelectric vibrator P is connected to earth of drive circuit 34. When transistor $T_R$ passes to the non conducting state on the trailing edge of each control pulse, all the energy accumulated in coil L is transmitted to the terminals of vibrator P, charging vibrator P at a voltage "v"(curve B, FIG. 5) higher than supply voltage +E. When vibrator P in turn starts to be discharged, diode D stops the current returning. It will be noted that between two successive pulse control signals, piezoelectric vibrator P can anyway be partially discharged through resistor R'. Thus, when there is no longer any control signal applied to transistor $T_R$ and the latter is thus in the non conducting state, the voltage across the terminals of vibrator P gradually returns to its rest value +E.

The operation of comparison circuit 36 will now be examined. This circuit includes comparing means formed by an analogue-digital converter COMP. One of the inputs of comparator COMP is connected to a connection node "c" of dc power source +E, whereas the other input of said comparator COMP is connected to output node "b" of drive circuit 34, in other words to the connection node between piezoelectric vibrator P and transistor $T_R$. As already specified hereinbefore, in the absence of a control signal applied at the base of transistor $T_R$, vibrator P is at rest and the voltage across its terminals is equal to supply voltage +E (curve B, FIG. 6). In these conditions, piezoelectric vibrator P is no longer used as a sound generator but may, conversely, be used as an acoustic wave receiver. Thus, under the effect of an incident acoustic signal, the voltage across the terminals of vibrator P will start to oscillate on either side of its rest voltage +E as is shown by curve B of FIG. 6. Comparator COMP then compares the voltage generated by vibrator P with its reference voltage which is supply voltage +E of drive circuit 34. Each time that the voltage generated by piezoelectric vibrator P exceeds reference voltage +E, comparator COMP will generate a pulse signal at its output "d" (curve D, FIG. 6). It is thus possible to convert an acoustic signal into a pseudo-digital signal. The pseudo-digital signal will then be used to control a microprocessor MP as is described in detail in the European Patent Application No. 99115319.8 in the name of the Applicant.

What is claimed is:

1. A communication system between a portable unit and a communication terminal, the communication terminal including at least means for transmitting an acoustic signal carrying data, and the portable unit including at least processing means for processing data, and receiving and conversion means including an electro-acoustic transducer for picking up said acoustic signal and converting said acoustic signal into data intended to be processed by said processing means, wherein the receiving means of the portable unit include an amplifier for the electric signal generated by the electro-acoustic transducer and a demodulator connected to the signal amplifier and intended for demodulating the acoustic signal received by the transducer and to transmit the demodulated signal to an input of a microcontroller which constitutes the processing means of said portable unit, the data carried by the acoustic signal transmitted by the communication terminal demodulated by the demodulator and processed by the microcontroller being stored in a memory associated with said microcontroller, the portable unit further including conversion and transmission means for converting data supplied by said processing means of said portable unit into an acoustic signal carrying data and for transmitting an acoustic signal, the communication terminal further including processing means for processing data and receiving and conversion means for receiving said acoustic signal transmitted by the portable unit and for converting said acoustic signal into data intended to be processed by said processing means of said communication terminal wherein the portable unit includes an alarm device, the receiving and conversion means of the portable unit and the conversion and transmission means of the portable unit including a same electro-acoustic transducer used as a sound generator in said device of the portable unit.

2. The communication system according to claim 1, wherein the conversion means of the portable unit include a modulation circuit which, via a drive circuit, activates the electro-acoustic transducer, the processing means of the portable unit which include a microcontroller controlling the modulation circuit using data originating from a memory associated with said microcontroller.

3. A communication system according to claim 1, wherein the receiving and conversion means of the portable unit include a sound generator circuit provided with a piezoelectric vibrator forming receiving means for the acoustic signal.

4. A communication system according to claim 3, wherein the receiving and conversion means of the portable unit further include comparison means for comparing the voltage generated by the piezoelectric vibrator when the acoustic signal is received with a reference voltage, these comparison means generating an electric signal representative of the data carried by said acoustic signal.

* * * * *